United States Patent
Huang et al.

(10) Patent No.: US 10,504,784 B2
(45) Date of Patent: Dec. 10, 2019

(54) INDUCTOR STRUCTURE FOR INTEGRATED CIRCUIT

(71) Applicant: Taiwan Semiconductor Manufacturing Co., Ltd., Hsin-Chu (TW)

(72) Inventors: Shih-Han Huang, Kaohsiung (TW);
Ching-Chun Wang, Tainan (TW);
Dun-Nian Yaung, Taipei (TW);
Hsing-Chih Lin, Tainan (TW);
Jen-Cheng Liu, Hsin-Chu (TW);
Min-Feng Kao, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/793,127

(22) Filed: Oct. 25, 2017

(65) Prior Publication Data
US 2019/0122931 A1    Apr. 25, 2019

(51) Int. Cl.
*H01L 21/822* (2006.01)
*H01F 17/00* (2006.01)
(Continued)

(52) U.S. Cl.
CPC ..... *H01L 21/8221* (2013.01); *H01F 17/0013* (2013.01); *H01F 41/041* (2013.01);
(Continued)

(58) Field of Classification Search
CPC ............... H01L 23/5227; H01L 23/645; H01L 21/8221; H01L 2924/19042
See application file for complete search history.

(56) References Cited

U.S. PATENT DOCUMENTS

| | | | | |
|---|---|---|---|---|
| 6,037,649 A | * | 3/2000 | Liou | .................... H01L 23/5227 257/531 |
| 2003/0013264 A1 | * | 1/2003 | Yeo | ..................... H01F 17/0013 438/381 |

(Continued)

FOREIGN PATENT DOCUMENTS

WO    2016136653 A1    9/2016

OTHER PUBLICATIONS

U.S. Appl. No. 16/106,525, filed Aug. 21, 2018.
(Continued)

*Primary Examiner* — Zandra V Smith
*Assistant Examiner* — John M Parker
(74) *Attorney, Agent, or Firm* — Eschweiler & Potashnik, LLC

(57) ABSTRACT

The present disclosure, in some embodiments, relates to an integrated circuit having an inductor with one or more turns arranged along vertical planes that intersect an underlying substrate. In some embodiments, the integrated circuit includes a plurality of conductive routing layers having conductive wires and conductive vias disposed within one or more dielectric structures abutting a first substrate. The plurality of conductive routing layers define an inductor having one or more turns respectively including a vertically extending segment arranged along a plane that intersects the first substrate. The vertically extending segment has a plurality of the conductive wires and the conductive vias.

20 Claims, 11 Drawing Sheets

(51) Int. Cl.
*H01F 41/04* (2006.01)
*H01L 21/768* (2006.01)
*H01L 23/00* (2006.01)
*H01L 27/08* (2006.01)
*H01L 49/02* (2006.01)

(52) U.S. Cl.
CPC ........ *H01L 21/76877* (2013.01); *H01L 24/74* (2013.01); *H01L 27/08* (2013.01); *H01L 28/10* (2013.01); *H01F 2017/002* (2013.01); *H01F 2017/004* (2013.01); *H01F 2017/0086* (2013.01)

(56) References Cited

U.S. PATENT DOCUMENTS

| | | | |
|---|---|---|---|
| 2007/0268105 A1* | 11/2007 | Walls | H01F 17/0013 336/200 |
| 2008/0061420 A1 | 3/2008 | Degani et al. | |
| 2008/0204183 A1* | 8/2008 | Loza | H01F 17/0013 336/200 |
| 2011/0108947 A1 | 5/2011 | Guzek et al. | |
| 2011/0308072 A1 | 12/2011 | Ahn | |
| 2012/0268229 A1* | 10/2012 | Yen | H01L 23/5227 336/200 |
| 2014/0011324 A1 | 1/2014 | Liu et al. | |
| 2015/0302975 A1* | 10/2015 | Qi | H01F 41/041 336/200 |
| 2017/0213638 A1 | 7/2017 | Otsubu | |
| 2017/0365402 A1 | 12/2017 | Fukushima | |
| 2018/0090260 A1 | 3/2018 | Ishida | |
| 2018/0218830 A1 | 8/2018 | Nakanishi | |
| 2019/0035534 A1 | 1/2019 | Suzuki | |
| 2019/0074131 A1 | 3/2019 | Yamanaka | |
| 2019/0156989 A1 | 5/2019 | Hu | |
| 2019/0164905 A1 | 5/2019 | Hsieh | |

OTHER PUBLICATIONS

U.S. Appl. No. 15/858,455, filed Dec. 29, 2017.
Silvaco. Questex11.in: Comparing One Turn and Straight Line Inductors. Date of publication is unknown. Retried online on Nov. 16, 2017 from https://www.silvaco.com/examples/quest/section1/example12/index.html.
Notice of Allowance dated Jul. 10, 2019 in connection with U.S. Appl. No. 16/106,525.

* cited by examiner

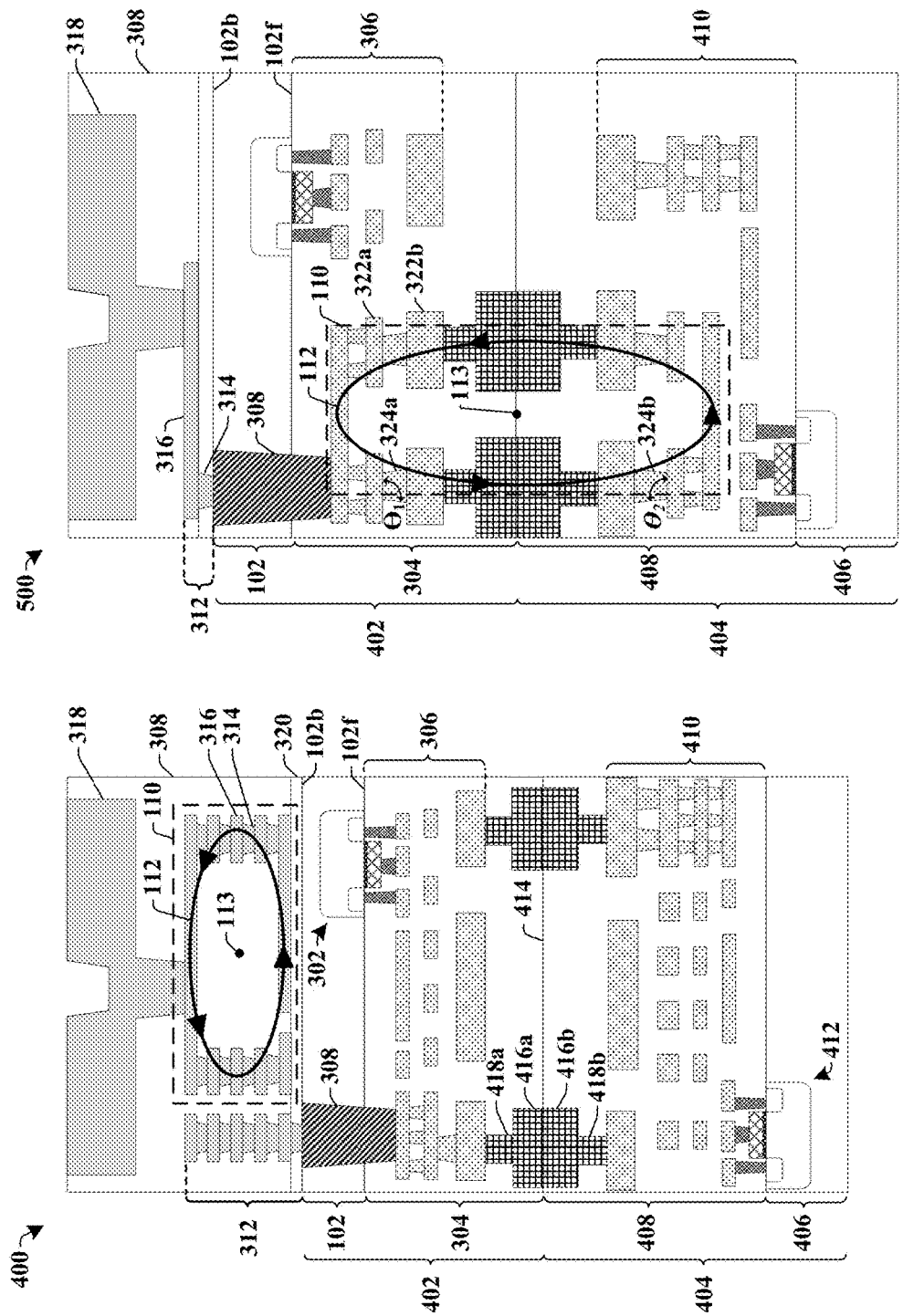

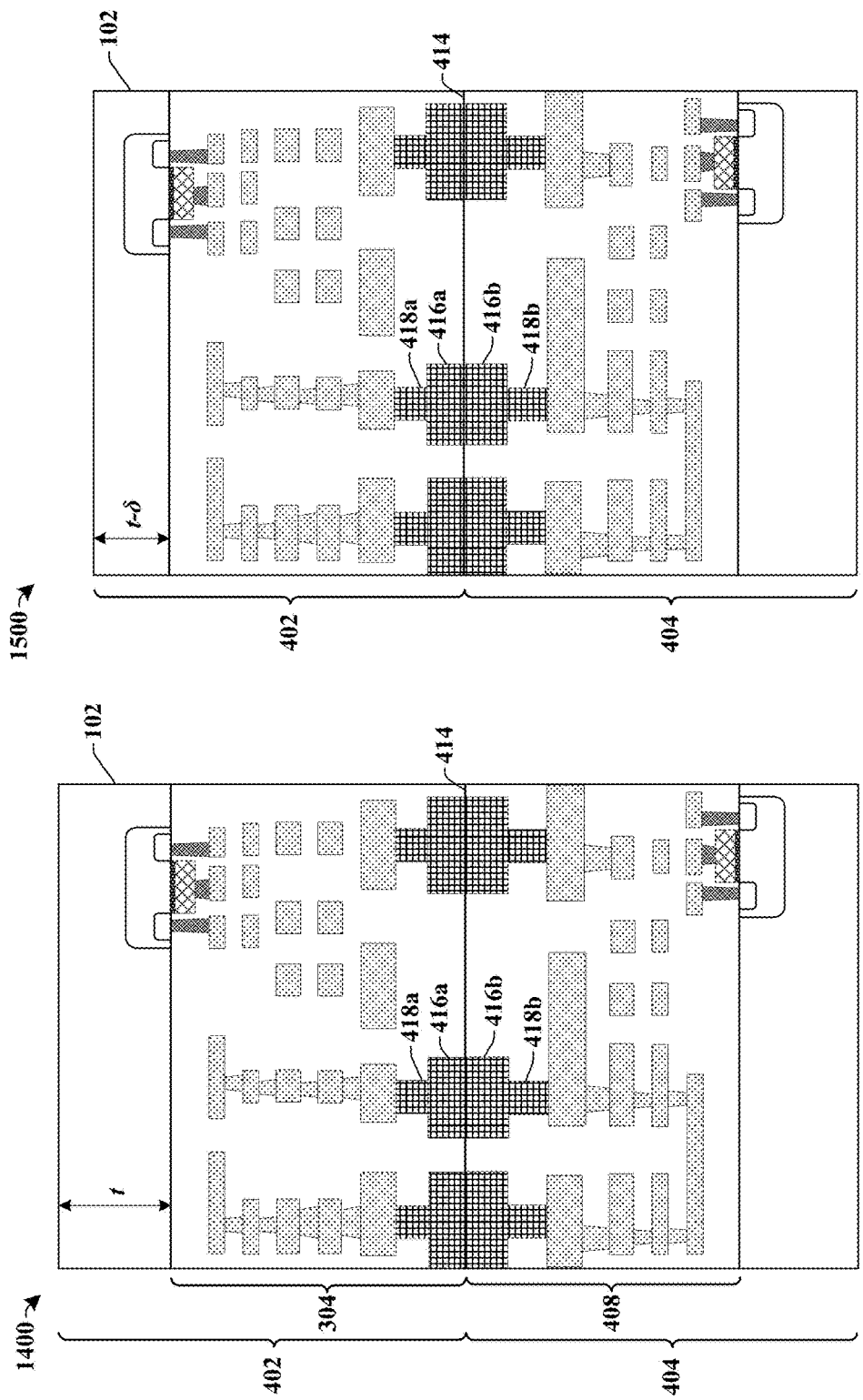

INDUCTOR STRUCTURE FOR INTEGRATED CIRCUIT

BACKGROUND

Semiconductor devices are used in a variety of electronic applications such as personal computers, cell phones, digital cameras, etc. To provide different functionalities for the different applications, integrated chips have circuits that use a wide range of active and passive devices. One commonly used passive device is an inductor. An inductor is a conductive coil having one or more turns, which is configured to store electrical energy in a magnetic field when electric current flows through it. Inductors are widely used in filters (e.g., RL filters), harmonic oscillators, and many other circuit components. The inductance L of an inductor may be calculated as:

$$L = \frac{\mu N^2 A}{l},$$

where L is inductance; $\mu$ is magnetic permeability; N is a number of turns of the inductor; A is area of the turns; and l is the length of the coil.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a cross-sectional view of some embodiments of a stacked integrated circuit structure having an inductor.

FIG. 5 illustrates a cross-sectional view of some additional embodiments of a stacked integrated circuit structure having an inductor.

FIGS. 12-17 illustrate cross-sectional views of some embodiments of a method of forming a stacked integrated circuit structure having an inductor.

DETAILED DESCRIPTION

Figure 1:
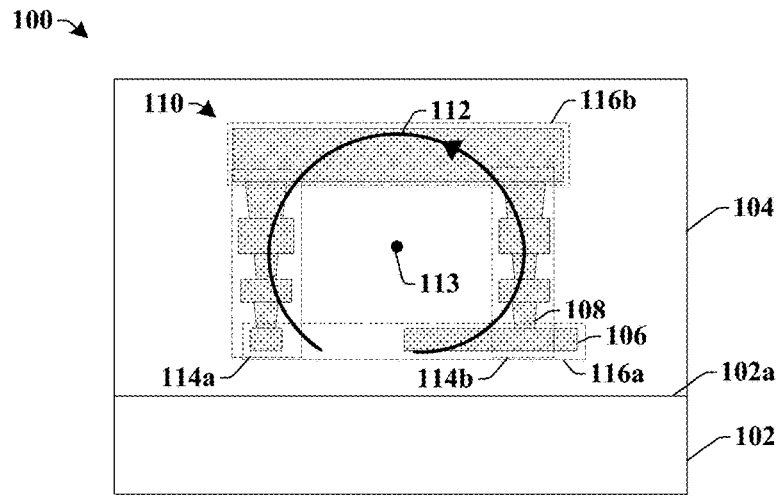
FIG. 1 illustrates a cross-sectional view of some embodiments of an integrated circuit having an inductor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the semiconductor industry, consumer demands have continually driven integrated circuits to have greater circuit densities. To achieve greater circuit densities, the semiconductor industry has continually reduced minimum feature sizes of various electronic components (e.g., transistors, diodes, resistors, capacitors, and others), so as to allow more components to be formed within a given area of an integrated chip. However, inductors face a number of difficulties related to such scaling.

Generally, inductors are formed within back-end-of-the-line (BEOL) metal interconnect layers over a substrate. An inductor comprises one or more turns respectively arranged on a metal interconnect wire layer. For example, an inductor may comprise a first turn arranged on a first metal interconnect wire layer and a second turn arranged on the first metal wire layer and surrounding the first turn. Because the inductance of an inductor is directly proportional to an area of the turns of the inductor, the inductor may consume a relatively large footprint to achieve a desired inductance.

Furthermore, it has been appreciated that inductors in integrated circuits also suffer from planarization problems due to chemical-mechanical planarization (CMP) processes used to form the metal interconnect wire layers. For example, a CMP process may cause dishing along an upper surface of a metal interconnect wire layer (as the metal may be removed at a faster rate than the surrounding dielectric). The dishing may change a resistance of a metal interconnect wire layer, thereby changing a current passing through an inductor and resulting response of the inductor.

The present disclosure, in some embodiments, relates to an integrated circuit having an inductor comprising one or more turns arranged along vertical planes that intersect an underlying substrate. In some embodiments, the integrated circuit has a plurality of conductive routing layers comprising conductive wires and conductive vias disposed within one or more dielectric structures abutting a first substrate. The plurality of conductive routing layers define an inductor having one or more turns respectively comprising a vertically extending segment arranged along a plane that intersects the first substrate. The vertically extending segment comprises a plurality of the conductive wires and the conductive vias. By orienting the inductor to have turns that are arranged along vertical planes that intersect an underlying substrate, a size of the inductor can be decreased and dishing issues affecting inductor performance can be mitigated.

FIG. 1 illustrates a cross-sectional view of some embodiments of an integrated circuit 100 comprising an inductor.

The integrated circuit 100 comprises an inductor 110 defined by conductive routing layers, 106 and 108, disposed within one or more dielectric structures arranged along one or more surfaces of a first substrate 102. In some embodiments, the one or more dielectric structures may comprise a first dielectric structure 104 disposed along a first surface 102a of the first substrate 102. In other embodiments (not shown), the one or more dielectric structures may further comprise a second dielectric structure disposed along a second surface of the first substrate 102 opposite the first surface 102a.

The inductor 110 has one or more turns 112 (one turn is shown in FIG. 1) winding around an axis 113. The axis 113 extends along a line that does not intersect a surface of first substrate 102 directly underlying the inductor 110. For example, in some embodiments, the axis 113 may extend in parallel to a first surface 102a of the first substrate 102. The one or more turns 112 respectively comprise a plurality of the conductive routing layers, 106 and 108. In some embodiments, the conductive routing layers, 106 and 108, may comprise alternating layers of conductive vias 108 (configured to provide vertical connections) and conductive wires 106 (configured to provide lateral connections). The conductive wires 106 extend past one or more sides of the conductive vias 108. For example, in some embodiments, the conductive wires 106 may extend past opposing sides of the conductive vias 108.

The one or more turns 112 of the inductor 110 respectively comprise one or more vertically extending segments 114a-114b coupled to one or more horizontally extending segments 116a-116b. The vertically extending segments 114a-114b are oriented so as to be arranged along planes that intersect the first substrate 102. The vertically extending segments 114a-114b respectively comprise a plurality of conductive wires 106 and conductive vias 108. For example, in some embodiments, the vertically extending segments 114a-114b may have two or more conductive wires 106 and two or more conductive vias 108. The horizontally extending segments 116a-116b extend in parallel to the first surface 102a of the first substrate 102 and comprise a conductive wire 106 coupled to one or more of the vertically extending segments 114a-114b.

By orienting the inductor 110 to wind around the axis 113, which does not intersect the first surface 102a of the first substrate 102 directly underlying the inductor 110, the turns 112 of the inductor 110 can have a relatively large area without causing the inductor 110 to consume a large footprint of the first substrate 102. Because the turns 112 can have a relatively large area, the inductor can provide for a relatively large inductance that allows the inductor 110 to meet design specifications while saving valuable space on the integrated circuit 100. Furthermore, because the turns 112 of the inductor extend in a vertically extending direction, the effects of CMP dishing are mitigated over traditional inductors (e.g., since dishing does not occur along an entire length of the turns 112 and therefore does not cause a large deviation of the turns 112 from their intended design).

Figure 2:
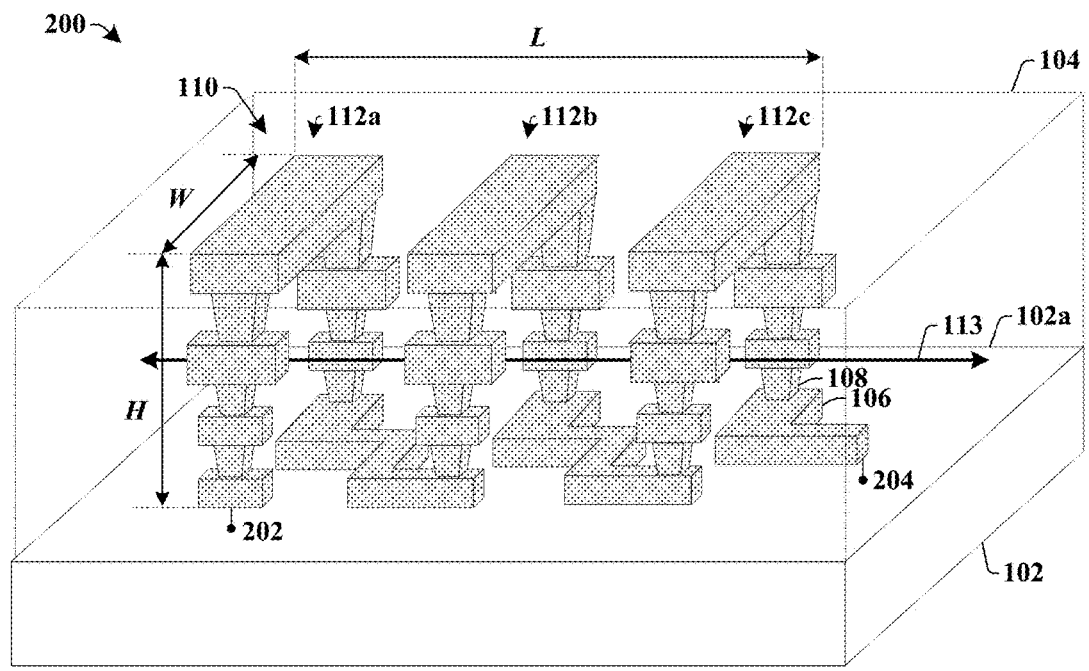
FIG. 2 illustrates a three-dimensional view of some embodiments of an integrated circuit having an inductor.

FIG. 2 illustrates a three-dimensional (3D) view of an integrated circuit 200 having an inductor.

The integrated circuit 200 comprises a plurality of conductive routing layers, 106 and 108, arranged within a first dielectric structure 104 over a first substrate 102. The first substrate 102 may be any type of semiconductor body (e.g., silicon, SiGe, SOI, etc.), as well as any other type of semiconductor and/or epitaxial layers, associated therewith. For example, in some embodiments, the first substrate 102 may comprise a base substrate and an epitaxial layer. The plurality of conductive routing layers, 106 and 108, comprise alternating layers of conductive wires 106 and conductive vias 108.

The plurality of conductive routing layers, 106 and 108, define an inductor 110. The inductor 110 has a first terminal 202 and a second terminal 204. During operation, a current is configured to flow from the first terminal 202 to the second terminal 204, or vice versa. As the current flows through the inductor 110 a magnetic field is generated along an axis 113. When the current flowing through the inductor 110 changes, the time-varying magnetic field induces a voltage according to Faraday's law of induction.

The inductor 110 has a plurality of turns 112a-112c winding around the axis 113. For example, the inductor 110 may comprise a first turn 112a, a second turn 112b, and a third turn 112c winding around the axis 113. The axis 113 extends along a line that does not intersect a region of the first substrate 102 directly underlying the inductor 110. The plurality of turns 112a-112c comprise vertically extending segments coupled together by horizontally extending segments. The vertically extending segments respectively comprise a plurality of conductive wires 106 and conductive vias 108, while the horizontally extending segments comprise conductive wires 106. In some embodiments, the horizontally extending segments may have a jog that allows the horizontally extending segments to connect adjacent ones of the plurality of turns 112a-112c. In some alternative embodiments, the vertically extending segments may also extend in a horizontal direction (e.g., the vertically extending segments may have vias that are horizontally offset along a horizontal direction). In such embodiments, the vertically extending segments may be connected to a horizontal segment that is substantially straight.

In some embodiments, the plurality of turns 112a-112c are connected together by way of a bottom one of the conductive wires 106. In other embodiments (not shown), the plurality of turns 112a-112c may be connected together by way of other ones of the conductive wires 106. For example, in some embodiments, the first turn 112a may be coupled to the second turn 112b by way of a top one of the conductive wires 106. In other embodiments, the first turn 112a may be coupled to the second turn 112b by way of one of the conductive wires 106 that is between the top and bottom conductive wires. In yet other embodiments, the first turn 112a may be coupled to the second turn 112b by way of a first one of the conductive wires 106 and the second turn 112b may be coupled to the third turn 112c by way of a second one of the plurality of conductive wires 106 that is at a different height from the first substrate 102 than the first one of the conductive wires 106.

The plurality of turns 112a-112c of the inductor 110 may be arranged along vertically extending planes that intersects the first substrate 102. Because the turns 112a-112c of the inductor 110 are arranged along vertically extending planes, the turns 112a-112c of the inductor 110 can have a relatively large area while taking up a relatively small footprint of the first substrate 102. Therefore, the inductor 110 is able to provide for a high inductance with a minimal footprint. For example, the plurality of turns 112a-112c may extends along a length (L) of 99.5 µm, and respectively have a width (W) of 200 µm and a height (H) of 300 µm, and a, to give the inductor 110 a footprint of approximately 19,990 micrometers$^2$. In comparison, an inductor having the same dimensions but oriented around an axis that intersects the first substrate 102 would have a significantly larger footprint of approximately 60,000 micrometers$^2$.

Figure 3A:
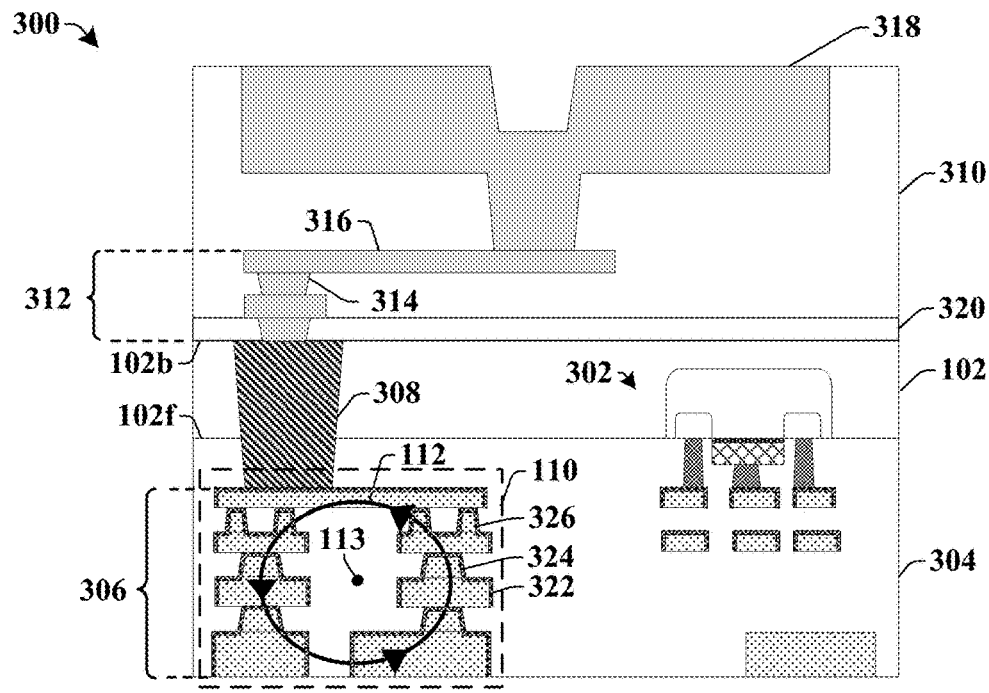
FIGS. 3A-3C illustrate cross-sectional views of some additional embodiments of integrated circuits having an inductor.
Figure 3B:
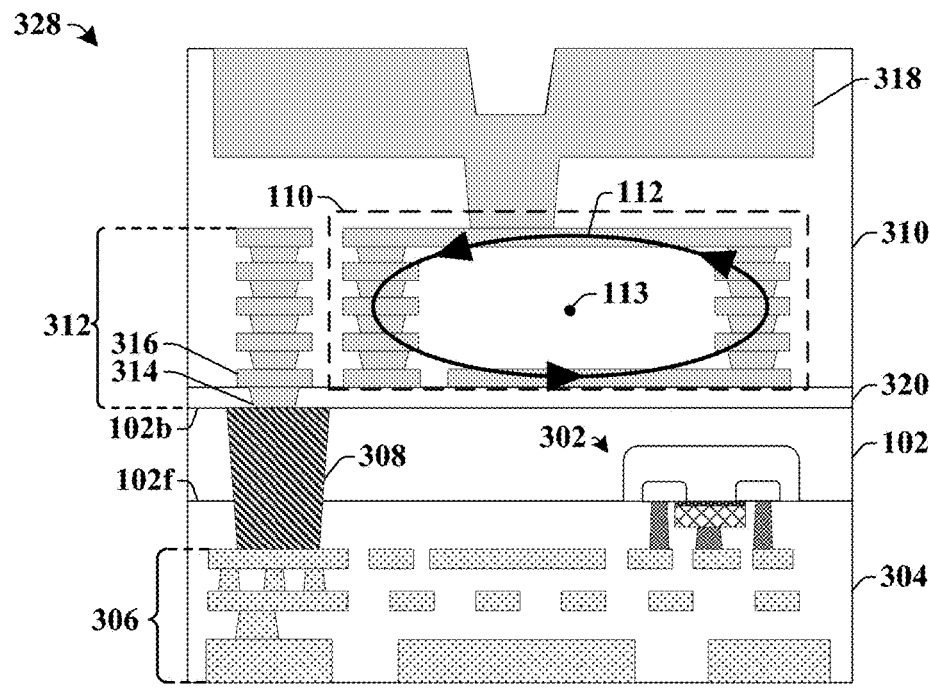
Figure 3C:
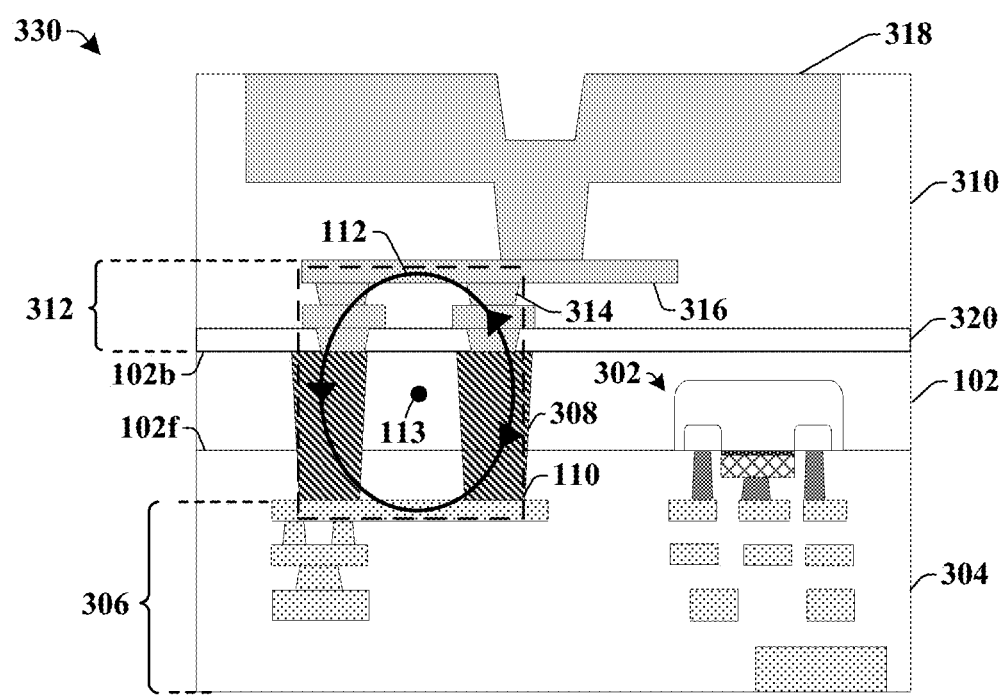

FIGS. 3A-3C illustrate cross-sectional views of some additional embodiments of integrated circuit structures having an inductor.

FIG. 3A illustrates a cross-sectional view of some additional embodiments of an integrated circuit structure 300 having an inductor arranged within conductive interconnect layers.

The integrated circuit structure 300 comprises a first inter-level dielectric (ILD) structure 304 arranged along a front side 102f of a first substrate 102 having a plurality of transistor devices 302. A second dielectric structure 310 is arranged along a back side 102b of the first substrate 102 opposing the front side 102f. The first ILD structure 304 surrounds a first plurality of conductive interconnect layers 306, comprising alternating layers of conductive interconnect wires 322 and conductive interconnect vias 324.

The second dielectric structure 310 surrounds a plurality of redistribution layers 312 configured to couple the first plurality of conductive interconnect layers 306 to a bond pad 318 arranged along the back side 102b of the first substrate 102. The bond pad 318 comprises a conductive material (e.g., a metal, such as aluminum or the like) and has an upper surface that is exposed. The bond pad 318 is configured to provide an electrical connection between the integrated circuit structure 300 and an external device. For example, a solder bump (not shown) may be formed onto the bond pad 318 to connect the bond pad 318 to an external I/O pin of an integrated chip package. In some embodiments, the second dielectric structure 310 may be separated from the first substrate 102 by a passivation layer 320. In such embodiments, the plurality of redistribution layers 312 extend though the passivation layer 320. In some embodiments, the passivation layer 320 may comprise an oxide, a nitride (e.g., silicon nitride), or the like.

The first plurality of conductive interconnect layers 306 define an inductor 110 comprising a plurality of turns 112 winding around an axis 113 that extends along a line that does not intersect a surface of the first substrate 102 directly underlying the inductor 110. The plurality of turns 112 respectively comprise a plurality of the conductive interconnect wires 322 and a plurality of the conductive interconnect vias 324. For example, a first turn comprises a vertically extending segment comprising a plurality of conductive interconnect wires 322 and conductive interconnect vias 324.

In some embodiments, a diffusion barrier layer 326 continuously extends along an outer boundary of a conductive interconnect wire 322 and a conductive interconnect via 324 between the conductive interconnect wire 322 and the first substrate 102. In such embodiments, a metal of the conductive interconnect wire 322 may directly contact a metal of the conductive interconnect via 324. In various embodiments, the diffusion barrier layer 326 may comprise tantalum (Ta), tantalum nitride (TaN), titanium (Ti), titanium nitride (TiN), cobalt-tungsten (CoW), or the like.

FIG. 3B illustrates a cross-sectional view of some additional embodiments of an integrated circuit structure 328 having an inductor arranged within redistribution layers.

The integrated circuit structure 328 comprises a first ILD structure 304 arranged along a front side 102f of a first substrate 102 and a second dielectric structure 310 arranged along a back side 102b of the first substrate 102. The first ILD structure 304 surrounds a first plurality of conductive interconnect layers 306. The second dielectric structure 310 surrounds a plurality of redistribution layers 312 configured to couple the first plurality of conductive interconnect layers 306 to a bond pad 318 disposed along the back side 102b of the first substrate 102.

The plurality of redistribution layers 312 comprise alternating layers of redistribution vias 314 and redistribution wires 316. In some embodiments, the plurality of redistribution layers 312 are coupled to the first plurality of conductive interconnect layers 306 by way of one or more through-substrate vias (TSVs) 308 extending through the first substrate 102. The plurality of redistribution layers 312 define an inductor 110 comprising a plurality of turns 112 winding around an axis 113 that extends along a line that does not intersect a region of the first substrate 102 directly underlying the inductor 110. The plurality of turns 112 respectively comprise a plurality of redistribution vias 314 and plurality of redistribution wires 316.

In some embodiments, the plurality of redistribution layers 312 have a larger size than the plurality of conductive interconnect layers. In some embodiments, the redistribution layers 312 may have layers with a height in a range of between approximately 1 µm and between approximately 50 µm. The relatively large size of the plurality of redistribution layers 312 allows for the inductor 110 to have turns with a relatively large area, thereby allowing the inductor 110 to have a small footprint while meeting device specifications.

FIG. 3C illustrates a cross-sectional view of some additional embodiments of an integrated circuit structure 330 having an inductor extending through a first substrate.

The integrated circuit structure 300 comprises a first ILD structure 304 arranged along a front side 102f of a first substrate 102 and a second dielectric structure 310 arranged along a back side 102b of the first substrate 102. The first ILD structure 304 surrounds a first plurality of conductive interconnect layers 306. The second dielectric structure 310 surrounds a plurality of redistribution layers 312 configured to couple the first plurality of conductive interconnect layers 306 to a bond pad 318 arranged along the back side 102b of the first substrate 102. A plurality of TSVs 308 extend though the first substrate 102, from one of the first plurality of conductive interconnect layers 306 to one of the plurality of redistribution layers 312.

An inductor 110 is defined by one or more of the first plurality of conductive interconnect layers 306, the TSVs 308, and one or more of the plurality of redistribution layers 312. The inductor 110 comprises a plurality of turns 112 winding around an axis 113 that extends along a line that does not intersect a surface of the first substrate 102 directly below the inductor 110. In some embodiments, the substrate 102 has a thickness in a range of between approximately 50 µm and between approximately 200 µm, which allows for the inductor 110 to have turns with a relatively large area.

FIG. 4 illustrates a cross-sectional view of some embodiments of a stacked integrated circuit structure 400 having an inductor.

The stacked integrated circuit structure 400 comprises a first integrated chip die 402 and a second integrated chip die 404. The first integrated chip die 402 comprises a first substrate 102 and a first ILD structure 304 arranged along a front side 102f of the first substrate 102. The first ILD structure 304 surrounds a first plurality of conductive interconnect layers 306. In some embodiments, the first substrate 102 may comprise one or more transistor devices 302. In other embodiments, the first substrate 102 may alternatively and/or additionally comprise imaging devices, or MEMs devices, for example. The second integrated chip die 404 comprises a second substrate 406 and a second ILD structure 408 between the first ILD structure 304 and the second substrate 406. The second ILD structure 408 surrounds a second plurality of conductive interconnect layers 410. In some embodiments, the second substrate 406 may comprise one or more transistor devices 412.

The first ILD structure 304 and the second ILD structure 408 respectively comprise a plurality of stacked ILD layers. In various embodiments, the plurality of stacked ILD layers may comprise one or more of an oxide (e.g., $SiO_2$, SiCO, etc.), a fluorosilicate glass, a phosphate glass (e.g., borophosphate silicate glass), or the like. The first plurality of conductive interconnect layers 306 and the second plurality of conductive interconnect layers 410 respectively comprise a plurality of alternating conductive interconnect via and conductive interconnect wire layers. In various embodiments, the plurality of alternating conductive interconnect via and conductive interconnect wire layers may comprise aluminum, copper, tungsten, or the like.

The first integrated chip die 402 is vertically stacked onto the second integrated chip die 404 in a face-to-face (F2F) hybrid bonding configuration. Within the F2F hybrid bonding configuration, the first ILD structure 304 contacts the second ILD structure 408 along a bonding interface 414. Furthermore, first conductive pads 416a within the first ILD structure 304 contact second conductive pads 416b within the second ILD structure 408 along the bonding interface 414. In some embodiments, the first conductive pads 416a are coupled to the first plurality of conductive interconnect layers 306 by way of a first conductive via 418a and the second conductive pads 416b are coupled to the second plurality of conductive interconnect layers 410 by way of a second conductive via 418b. In some embodiments, the conductive pads 416a-416b and the conductive vias 418a-418b may comprise a metal, such as copper.

In some embodiments, the first plurality of conductive interconnect layers 306 are coupled to a plurality of redistribution layers 312 disposed along a back side 102b of the first substrate 102 by way of a TSV 308 extending through the first substrate 102. The plurality of redistribution layers 312 couple the first plurality of conductive interconnect layers 306 to a bond pad 318 disposed along the back side 102b of the first substrate 102. The plurality of redistribution layers 312 define an inductor 110 comprising a plurality of turns 112 winding around an axis 113 that extends along a line that does not intersect a surface of the first substrate 102 directly underlying the inductor 110. The plurality of turns 112 respectively comprise a plurality of redistribution vias 314 and plurality of redistribution wires 316.

FIG. 5 illustrates a cross-sectional view of some alternative embodiments of a stacked integrated circuit structure 500 having an inductor.

The stacked integrated circuit structure 500 comprises a first integrated chip die 402 stacked onto the second integrated chip die 404 in a face-to-face (F2F) hybrid bonding configuration. The first integrated chip die 402 comprises a first substrate 102 and a first ILD structure 304 arranged along a front side 102f of the first substrate 102. The first ILD structure 304 surrounds a first plurality of conductive interconnect layers 306. The second integrated chip die 404 comprises a second substrate 406 and a second ILD structure 408 arranged between the first ILD structure 304 and the second substrate 406. The second ILD structure 408 surrounds a second plurality of conductive interconnect layers 410.

The first plurality of conductive interconnect layers 306 and the second plurality of conductive interconnect layers 410 collectively define an inductor 110 comprising a plurality of turns 112 winding around an axis 113 that extends along a line that does not intersect a surface of the first substrate 102 directly underlying the inductor 110. The plurality of turns 112 respectively comprise a first plurality of conductive interconnect wires and conductive interconnect vias of the first plurality of conductive interconnect layers 306 and a second plurality of conductive interconnect wires and conductive interconnect vias of the second plurality of conductive interconnect layers 410.

In some embodiments, the first plurality of conductive interconnect layers 306 have a size that increases as a distance from the first substrate 102 increases. For example, a first conductive interconnect wire 322a may have a smaller size than a second conductive interconnect wire 322b separated from the first substrate 102 by the first conductive interconnect wire 322a. Similarly, the second plurality of conductive interconnect layers 410 may also have a size that increases as a distance from the second substrate 406 increases. Because the sizes of the first plurality of conductive interconnect layers 306 and the second plurality of conductive interconnect layers 410 increase as a distance from an associated substrate increases, the inductor 110 may have a vertically extending segment comprising conductive interconnect wires that increase in size from a first width to a second width and decrease in size from the second width to a third width (e.g., substantially equal to the first width) along a line extending in a direction intersecting the front side 102f of the first substrate 102.

In some embodiments, the conductive interconnect vias and conductive interconnect wires within the first plurality of conductive interconnect layers 306 have angled sidewalls that cause a size of respective ones of the first plurality of conductive interconnect layers 306 to increase as a distance from the first substrate 102 increases. For example, the first plurality of conductive interconnect layers 306 may comprise a first conductive interconnect via 324a having sidewalls angled at an angle $\theta_1$ so that a width of the first conductive interconnect via 324a increases as a distance from the first substrate 102 increases. Similarly, the conductive interconnect vias and conductive interconnect wires within the second plurality of conductive interconnect layers 410 have angled sidewalls that cause a size of respective ones of the second plurality of conductive interconnect layers 410 to increase as a distance from the second substrate 406 increases. For example, the second plurality of conductive interconnect layers 410 may comprise a second conductive interconnect via 324b having sidewalls angled at an angle $\theta_2$ so that a width of the second conductive interconnect via 324b increases as a distance from the second substrate 406 increases. Because the inductor 110 is defined by the first plurality of conductive interconnect layers 306 and second plurality of conductive interconnect layers 410, the vertically extending segment of the inductor 110 has a first conductive interconnect via 324a having a width that increases as a distance from the first substrate 102 increases and a second conductive interconnect via 324b having a width that decreases as a distance from the first substrate 102 increases.

Figures 6, 7:
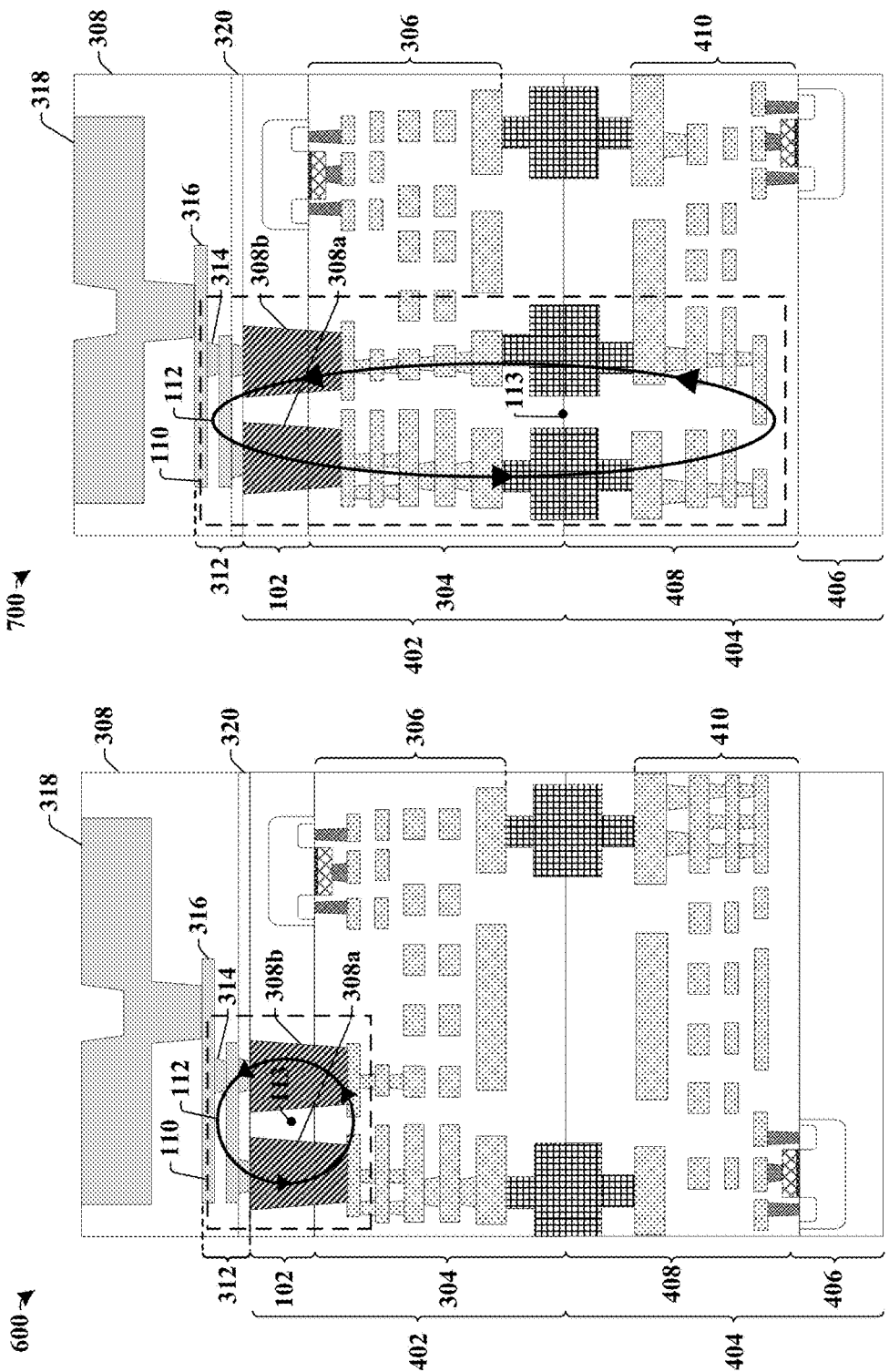
FIG. 6 illustrates a cross-sectional view of some additional embodiments of a stacked integrated circuit structure having an inductor.
FIG. 7 illustrates a cross-sectional view of some additional embodiments of a stacked integrated circuit structure having an inductor.

FIG. 6 illustrates a cross-sectional view of some alternative embodiments of a stacked integrated chip structure 600 having an inductor.

The stacked integrated chip structure 600 comprises an inductor 110 defined by one or more of a first plurality of conductive interconnect layers 306, TSVs 308a-308b, and one or more of a plurality of redistribution layers 312. The inductor 110 comprises a plurality of turns 112 respectively extending through the first substrate 102. For example, the inductor 110 may comprise a turn respectively having a first vertically extending segment that comprises a first TSV 308a extending through the first substrate 102 and a second vertically extending segment that comprises a second TSV 308b extending through the first substrate 102. The plurality of turns 112 wind around an axis 113 that extends along a line that does not intersect a surface of the first substrate 102 directly underlying the inductor 110.

FIG. 7 illustrates a cross-sectional view of some alternative embodiments of a stacked integrated chip structure 700 having an inductor.

The stacked integrated chip structure 700 comprises an inductor 110 defined by a first plurality of conductive interconnect layers 306, a second plurality of conductive interconnect layers 410, a plurality of TSVs 308a-308b, and one or more of a plurality of redistribution layers 312. The inductor 110 comprises a plurality of turns 112 respectively extending through the first substrate 102. For example, the inductor 110 may comprise a turn respectively having a first vertically extending segment that comprises a first TSV 308a extending through the first substrate 102 and a second vertically extending segment that comprises a second TSV 308b extending through the first substrate 102. The inductor 110 comprises a plurality of turns 112 winding around an axis 113 that extends along a line that does not intersect a surface of the first substrate 102 directly underlying the inductor 110.

In some embodiments, one or more of the plurality of TSVs 308, the first plurality of conductive interconnect layers 306, the second plurality of conductive interconnect layers 410, and/or the plurality of redistribution layers 312 may comprise different materials, so that the vertically extending segments of the inductor 110 comprise components having different materials. For example, the first plurality of conductive interconnect layers 306 may comprise copper, the plurality of TSVs 308 may comprise copper, and the plurality of redistribution layers 312 may comprise aluminum.

Figure 8:
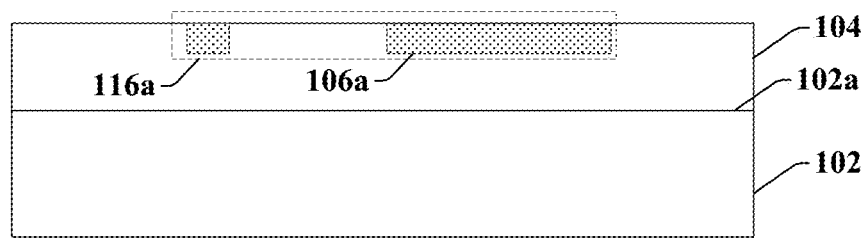
FIGS. 8-10 illustrate cross-sectional views of some embodiments of a method of forming an integrated circuit having an inductor.
Figure 9:
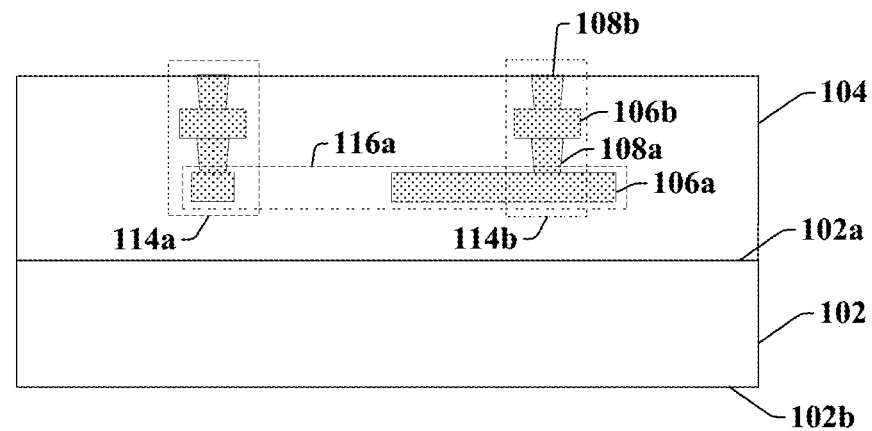
Figure 10:
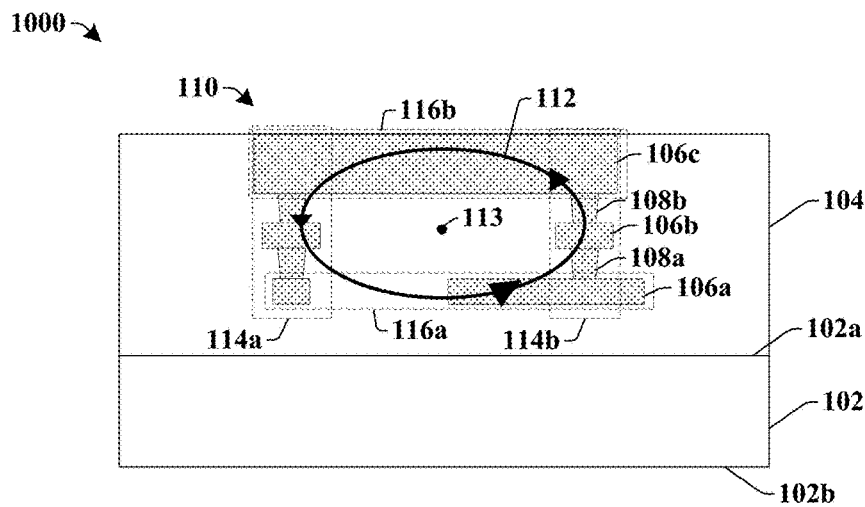

FIGS. 8-10 illustrate cross-sectional views 800-1000 of some embodiments of a method of forming an integrated circuit having an inductor. Although FIGS. 8-10 are described in relation to a method, it will be appreciated that the structures disclosed in FIGS. 8-10 are not limited to such a method, but instead may stand alone as structures independent of the method.

As shown in cross-sectional view 800 of FIG. 8, a first conductive wire 106a defining a first horizontal segment 116a of an inductor is formed within a first dielectric structure 104 arranged along a first surface of a first substrate 102.

As shown in cross-sectional view 900 of FIG. 9, one or more conductive wires 106b and/or conductive vias 108a-108b are formed to define a first vertical segment 114a and a second vertical segment 114b of the inductor. In some embodiments, the one or more conductive wires 106b and/or conductive vias 108a-108b may be formed within the first dielectric structure 104. In other embodiments (not shown), the one or more conductive wires 106b and/or conductive vias 108a-108b may be formed within a second dielectric structure arranged along a back side 102b of the first substrate 102 opposite the first surface 102a. In yet other embodiments (not shown), the one or more conductive wires 106b and/or conductive vias 108a-108b may comprise through-substrate vias (TSVs) formed within the first substrate 102.

As shown in cross-sectional view 1000 of FIG. 10, a second conductive wire 106c defining a second horizontal segment 116b of the inductor 110 is formed within the first dielectric structure 104 or the second dielectric structure (not shown). The second horizontal segment 116b of the inductor 110 completes a turn 112 of the inductor 110, which winds around an axis 113 that extends along a line that does not intersect a surface of the first substrate 102 directly underlying the inductor 110.

Figure 11:
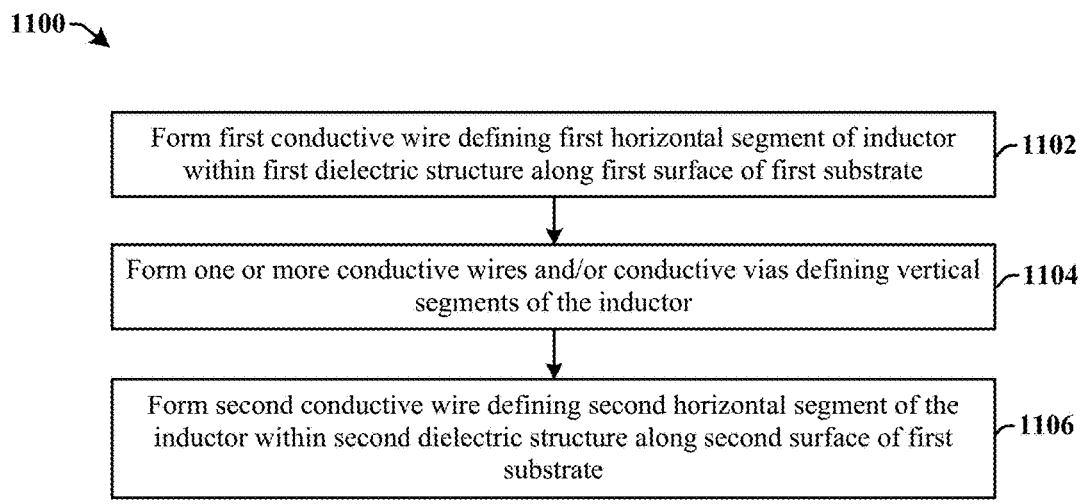
FIG. 11 illustrate a flow diagram of some embodiments of a method of forming an integrated circuit having an inductor.

FIG. 11 illustrate a flow diagram of some embodiments of a method 1100 of forming an integrated circuit having an inductor.

While the disclosed methods (e.g., methods 1100 and 1800) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a first conductive wire is formed within a first dielectric structure arranged along a first surface of a first substrate to define a first horizontal segment of an inductor. FIG. 8 illustrates a cross-sectional view 800 of some embodiments corresponding to act 1102.

At 1104, one or more conductive wires and/or conductive vias are formed to define a vertical segments of the inductor coupled to the first horizontal segment. FIG. 9 illustrates a cross-sectional view 900 of some embodiments corresponding to act 1104.

At 1106, a second conductive wire is formed within a second dielectric structure arranged along a second surface of the first substrate to define a second horizontal segment of an inductor. In some embodiments, the first dielectric structure may be the same as the second dielectric structure, while in other embodiments, the first and second dielectric structures may comprise different dielectric structures separate by the first substrate. FIG. 10 illustrates a cross-sectional view 1000 of some embodiments corresponding to act 1106.

FIGS. 12-17 illustrate cross-sectional views 1200-1700 of some embodiments of a method of forming a stacked integrated chip structure having an inductor. Although FIGS. 12-17 are described in relation to a method, it will be appreciated that the structures disclosed in FIGS. 12-17 are not limited to such a method, but instead may stand alone as structures independent of the method.

Figure 12:
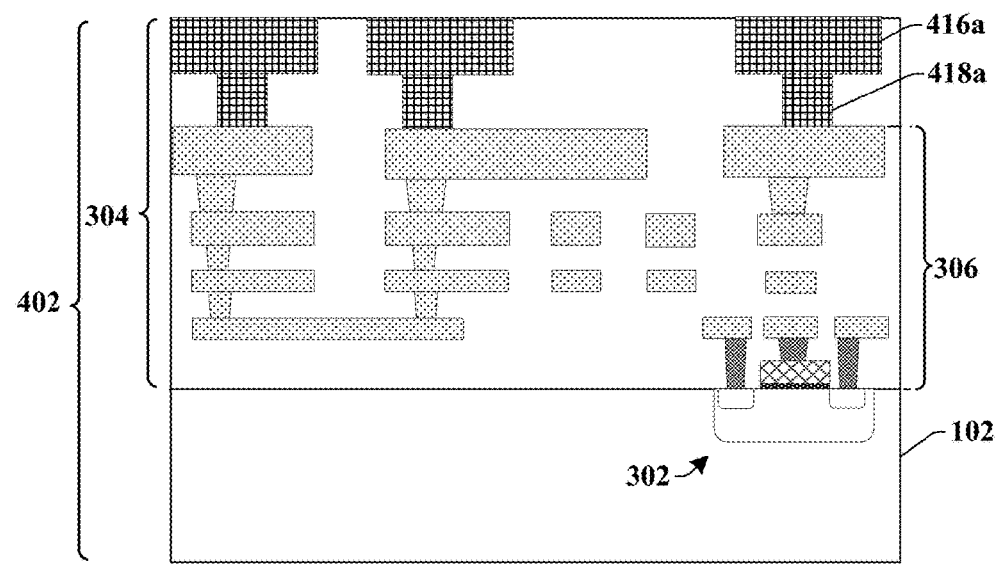

As shown in cross-sectional view 1200 of FIG. 12, a first integrated chip die 402 is formed by forming a first plurality of conductive interconnect layers 306 within a first ILD structure 304 comprising a first plurality of stacked ILD layers over a first substrate 102. In some embodiments, the first plurality of conductive interconnect layers 306 may be formed using a damascene process (e.g., a single damascene process or a dual damascene process). The damascene process is performed by forming an ILD layer over the first substrate 102, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electroless plating, etc.). In various embodiments, the first plurality of conductive interconnect layers 306 may comprise tungsten, copper, or aluminum copper, or the like.

In some embodiments, first conductive pads 416a may be formed within the first ILD structure 304 over the first plurality of conductive interconnect layers 306. The first conductive pads 416a may be coupled to the first plurality of conductive interconnect layers 306 by way of first conductive vias 418a. In some embodiments, the first conductive pads 416a and the first conductive vias 418a may comprise a metal, such as copper.

Figure 13:
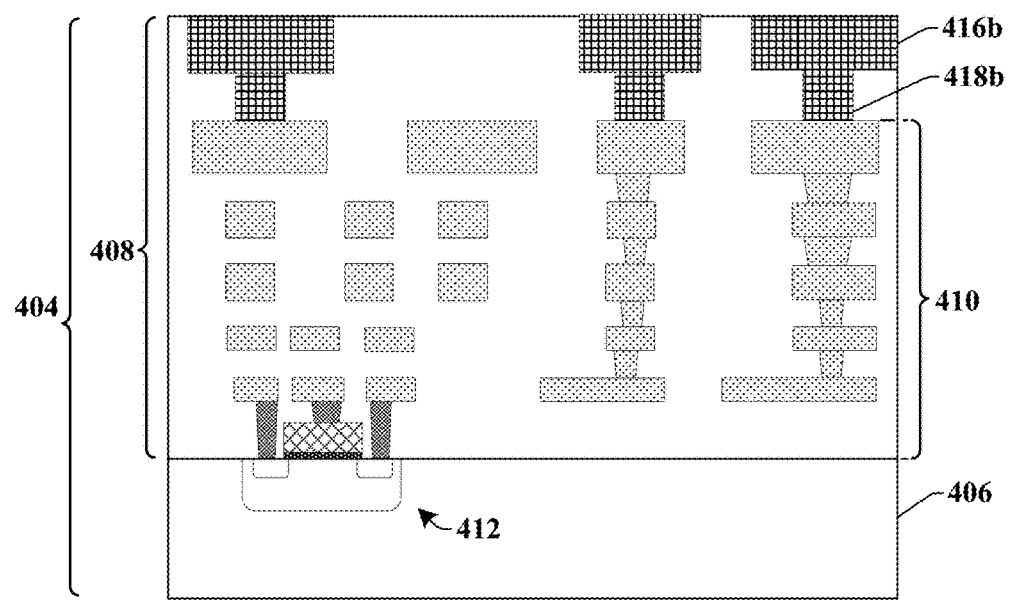

As shown in cross-sectional view 1300 of FIG. 13, a second integrated chip die 404 is formed by forming a second plurality of conductive interconnect layers 410 within a second ILD structure 408 comprising a second plurality of stacked ILD layers over a second substrate 406. In some embodiments, the second plurality of conductive interconnect layers 410 may be formed using a damascene process (e.g., a single damascene process or a dual damascene process), as described above. In some embodiments, second conductive pads 416b may be formed within the second ILD structure 408 over the second plurality of conductive interconnect layers 410. The second conductive pads 416b may be coupled to the second plurality of conductive interconnect layers 410 by way of second conductive vias 418b. In some embodiments, the second conductive pads 416b and the second conductive vias 418b may comprise a metal, such as copper.

As shown in FIG. 1400 of FIG. 14, the first integrated chip die 402 is bonded to the second integrated chip die 404 along a bonding interface 414. Along the bonding interface 414, the first ILD structure 304 abuts the second ILD structure 408 and the first conductive pads 416a abut the second conductive pads 416b. In some embodiments, the bonding is performed by aligning the first conductive pads 416a and the second conductive pads 416b and then applying pressure and heat. The pressure may be less than or equal to approximately 30 MPa, and the heat may be in a range of between approximately 100° C. and 500° C. The hybrid bonding process results in a bond being formed between both dielectric and conductive materials.

As shown in cross-sectional view 1500 of FIG. 15, the first substrate 102 is thinned to reduce a thickness of the first substrate 102 (e.g., from a thickness t to a thickness t–δ). The first substrate 102 may be thinned by way of an etching process and/or by physical grinding process. In some embodiments, the first substrate 102 may have a thickness reduced from a first thickness t in a range of between approximately 700 μm and approximately 1000 μm to a second thickness t–δ in a range of between approximately 50 μm to approximately 200 μm.

Figures 16, 17:

As shown in cross-sectional view 1600 of FIG. 16, a plurality of TSVs 308 are formed to extend through the first substrate 102. The plurality of TSVs 308 extend from the first plurality of conductive interconnect layers 306 to a back-side of the first substrate 102. In some embodiments, the plurality of TSVs 308 are formed by forming a masking layer on the back side 102b of the first substrate 102. In various embodiments, the masking layer may comprise a dielectric material, such as silicon dioxide, silicon nitride, or the like. After the masking layer is formed, the first substrate 102 is selectively exposed to one or more etchants configured to form sidewalls that define TSV openings 1602 extending through the first substrate 102. In various embodiments, the one or more etchants may comprise dry and/or wet etchants. After the TSV openings 1602 are defined, a conductive material is formed within the TSV openings 1602 to form the plurality of TSVs 308. The conductive material may be formed by depositing a barrier layer and/or a seed layer within the TSV openings 1602 and subsequently performing a plating process (e.g., an electro plating process or an electro-less plating process) to fill the TSV openings 1602 with the conductive material.

In some embodiments, the conductive material may comprise a metal, such as copper. In some embodiments, the barrier layer may comprise tantalum (Ta), tantalum nitride (TaN), titanium (Ti), titanium nitride (TiN), cobalt-tungsten (CoW), or the like. In some embodiments, the conductive material may be separated from the first substrate 102 by way of a dielectric liner. In various embodiments, the dielectric liner may comprise an oxide, a nitride, or the like. For example, the dielectric liner may comprise silicon oxide deposited by plasma enhanced chemical vapor deposition (PECVD) using silane or TEOS as the silicon source. An etching process can be performed to remove the dielectric liner from the bottom of the TSV openings 1602 prior to formation of the barrier layer and the seed layer.

As shown in cross-sectional view 1700 of FIG. 17, a plurality of redistribution layers 312 are formed over the TSVs 308. The plurality of redistribution layers 312 may be formed by depositing a metal and then subsequently patterning the metal to define a redistribution layer. A dielectric layer is then formed over the redistribution layer. In various embodiments, the plurality of redistribution layers 312 may comprise a metal, such as aluminum, copper, or the like. In various embodiments, the dielectric layer may comprise an epoxy, polyimide, benzocyclobutene (BCB), polybenzoxazole (PBO), or the like.

As shown in cross-sectional view 1700, the plurality of redistribution layers 312, the TSVs 308, the first plurality of conductive interconnect layers 306, and the second plurality of conductive interconnect layers 410 define an inductor 110 comprises a plurality of turns 112 respectively extending through the first substrate 102. In other embodiments, illustrated above, the inductor 110 may be defined by one or more of the plurality of redistribution layers 312, the TSVs 308, the first plurality of conductive interconnect layers 306, and the second plurality of conductive interconnect layers 410.

Figure 18:
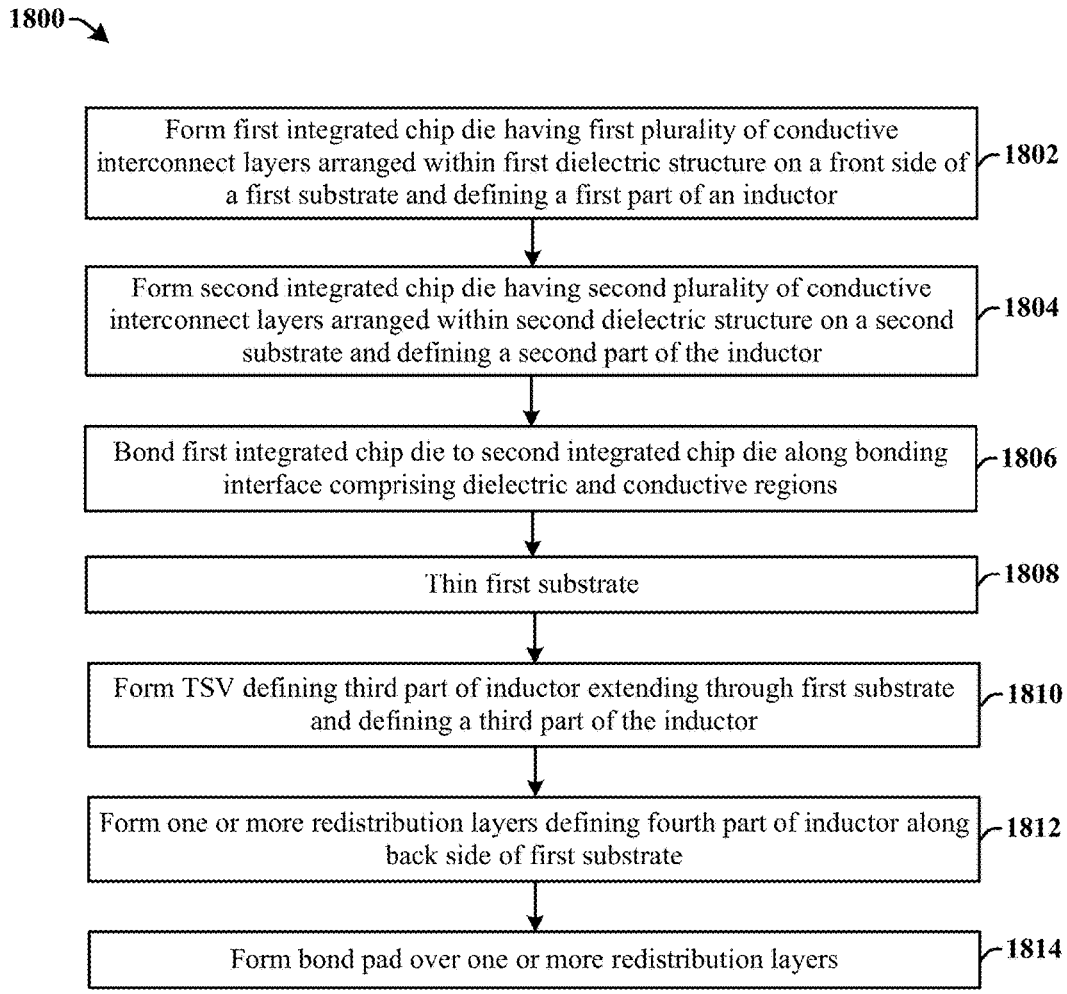
FIG. 18 illustrates a flow diagram of some embodiments of a method of forming a stacked integrated circuit structure having an inductor.

FIG. 18 illustrate a flow diagram of some embodiments of a method 1800 of forming an integrated chip having an inductor.

At 1802, a first integrated chip die is formed by forming a first plurality of conductive interconnect layers within a first dielectric structure on a front side of a first substrate. In some embodiments, the first plurality of conductive interconnect layers define a part of an inductor. In other embodiments, the first plurality of conductive interconnect layers do not define a part of an inductor. FIG. 12 illustrates a cross-sectional view 1200 of some embodiments corresponding to act 1802.

At 1804, a second integrated chip die is formed by forming a second plurality of conductive interconnect layers within a second dielectric structure on a second substrate. In some embodiments, the second plurality of conductive interconnect layers define a part of an inductor. In other embodiments, the second plurality of conductive interconnect layers do not define a part of an inductor. FIG. 13 illustrates a cross-sectional view 1300 of some embodiments corresponding to act 1804.

At 1806, the first integrated chip die is bonded to the second integrated chip die along a hybrid bonding interface comprising dielectric and conductive materials. FIG. 14 illustrates a cross-sectional view 1400 of some embodiments corresponding to act 1806.

At 1808, the first substrate is thinned. Thinning the first substrate reduces a thickness of the first substrate. FIG. 15 illustrates a cross-sectional view 1500 of some embodiments corresponding to act 1808.

At 1810, TSVs are formed, which extend though the first substrate to the first plurality of conductive interconnect layers. In some embodiments, the TSVs define a part of an inductor. In other embodiments, the TSVs do not define a part of an inductor. FIG. 16 illustrates a cross-sectional view 1600 of some embodiments corresponding to act 1810.

At 1812, one or more redistribution layers are formed along a back side of the first substrate. The one or more redistribution layers are arranged within a dielectric structure disposed onto an opposite side of the first substrate as the first ILD structure. In some embodiments, the one or more redistribution layers define a part of an inductor. In other embodiments, the one or more redistribution layers do not define a part of an inductor. FIG. 17 illustrates a cross-sectional view 1700 of some embodiments corresponding to act 1812.

At 1814, a bond pad is formed over the one or more redistribution layers. The bond pad is coupled to the first plurality of conductive interconnect layers by the one or more redistribution layers. FIG. 17 illustrates a cross-sectional view 1700 of some embodiments corresponding to act 1814.

Therefore, the present disclosure relates to an integrated chip having an inductor that is oriented to wind around an axis that does not intersect a region of the substrate directly underlying the inductor.

In some embodiments, the present disclosure relates to an integrated circuit. The integrated chip comprises a plurality of conductive routing layers having conductive wires and conductive vias disposed within one or more dielectric structures abutting a first substrate. The plurality of conductive routing layers define an inductor having one or more turns respectively comprising a vertically extending segment arranged along a plane that intersects the first substrate. The vertically extending segment comprises a plurality of the conductive wires and the conductive vias.

In other embodiments, the present disclosure relates to a semiconductor device. The semiconductor device comprises a first substrate and a plurality of conductive routing layers within one or more dielectric structures abutting the first substrate. The plurality of conductive routing layers define an inductor having one or more turns that wind around an axis extending parallel to a first surface of the first substrate facing one of the one or more dielectric structures.

In yet other embodiments, the present disclosure relates to a method of forming an integrated circuit. The method comprises forming a first conductive wire defining a first horizontal segment of an inductor within a first dielectric structure along a first surface of a first substrate. The method further comprises forming one or more conductive wires or conductive vias defining vertical segments of the inductor. The method further comprises forming a second conductive wire defining a second horizontal segment of the inductor within a second dielectric structure along a second surface of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a plurality of conductive routing layers comprising conductive wires and conductive vias disposed within one or more dielectric structures abutting a first substrate;
wherein the plurality of conductive routing layers define an inductor having one or more turns respectively comprising a vertically extending segment arranged along a plane that intersects the first substrate;
wherein the vertically extending segment comprises a plurality of the conductive wires and the conductive vias;
wherein the vertically extending segment comprises:
a first conductive interconnect via having first sidewalls angled to increase a first width of the first conductive interconnect via as a distance from the first substrate increases; and
a second conductive interconnect via having second sidewalls angled to decrease a second width of the second conductive interconnect via as the distance from the first substrate increases.

2. The integrated circuit of claim 1, wherein the one or more turns respectively wind around an axis that extends along a line that does not intersect a first surface of the first substrate facing one of the one or more dielectric structures.

3. The integrated circuit of claim 1, wherein the plurality of conductive routing layers comprise a first plurality of conductive interconnect layers arranged within a first inter-level dielectric (ILD) structure comprising a plurality of stacked ILD layers.

4. The integrated circuit of claim 3, further comprising:
a second substrate; and
a second ILD structure disposed between the second substrate and the first ILD structure and surrounding a second plurality of conductive interconnect layers, wherein the plurality of conductive routing layers further comprise the second plurality of conductive interconnect layers.

5. The integrated circuit of claim 1, further comprising:
a first ILD structure arranged along a first surface of the first substrate and surrounding a first plurality of conductive interconnect layers; and
a plurality of redistribution layers arranged along a second surface of the first substrate and configured to couple the first plurality of conductive interconnect layers to a bond pad, wherein the plurality of redistribution layers comprise the plurality of conductive routing layers.

6. The integrated circuit of claim 1, wherein the vertically extending segment comprises a through-substrate via (TSV) extending through the first substrate.

7. The integrated circuit of claim 1, wherein the plurality of conductive wires defining the vertically extending segment increase in size from a third width to a fourth width and decrease in size from the fourth width to a fifth width along a line intersecting a first surface of the first substrate facing one of the one or more dielectric structures.

8. The integrated circuit of claim 1, wherein the one or more turns extend through the first substrate.

9. The integrated circuit of claim 1, further comprising:
a first ILD structure arranged along a first surface of the first substrate, wherein the first ILD structure surrounds a first plurality of conductive interconnect layers;
through-substrate vias (TSVs) extending through the first substrate;
an additional dielectric structure arranged along a second surface of the first substrate opposite the first surface, wherein the additional dielectric structure surrounds a plurality of redistribution layers coupled to the first plurality of conductive interconnect layers by the TSVs; and
wherein the vertically extending segment is defined by the first plurality of conductive interconnect layers, the TSVs, and the plurality of redistribution layers.

10. A semiconductor device, comprising:
a first substrate;
a passivation layer disposed along a first side of the first substrate;
one or more redistribution layers disposed within one or more dielectric structures and separated from the first side of the first substrate by the passivation layer;
a first plurality of conductive interconnect layers within a first inter-level dielectric (ILD) structure along a second side of the first substrate opposing the first side;
a through-substrate-via (TSV) extending through the first substrate and coupling the first plurality of conductive interconnect layers to the one or more redistribution layers; and
wherein the one or more redistribution layers define at least a part of an inductor having one or more turns that wind around an axis extending parallel to a first surface of the first substrate facing one of the one or more dielectric structures.

11. The semiconductor device of claim 10, wherein the one or more turns comprise:
a first turn including a first pair of vertically extending segments respectively comprising a first plurality of conductive wires and conductive vias;
a second turn including a second pair of vertically extending segments respectively comprising a second plurality of conductive wires and conductive vias; and
wherein one of the first pair of vertically extending segments is coupled to one of the second pair of vertically extending segments by a horizontally extending segment comprising a conductive wire.

12. The semiconductor device of claim 11, wherein the TSVs have a width that increases as a distance from the passivation layer decreases.

13. The semiconductor device of claim 10,
wherein the inductor is further defined by comprise the first plurality of conductive interconnect layers.

14. The semiconductor device of claim 13, further comprising:
a second substrate;
a second ILD structure between the second substrate and the first ILD structure; and
a second plurality of conductive interconnect layers within the second ILD structure, wherein the inductor is further defined by the second plurality of conductive interconnect layers.

15. The semiconductor device of claim 14,
wherein the inductor is further defined by the TSVs; and
wherein at least one of the TSVs directly contacts one of the first plurality of conductive interconnect layers defining a bottommost surface of the inductor.

16. The semiconductor device of claim 10,
wherein the one or more turns are arranged completely over the first side of the first substrate.

17. The semiconductor device of claim 10, wherein all of the TSVs that define the inductor are arranged along outermost lateral edges of the inductor.

18. An integrated circuit, comprising:
a plurality of conductive routing layers comprising conductive wires and conductive vias disposed within one or more dielectric structures abutting a first substrate;
wherein the plurality of conductive routing layers define an inductor having one or more turns respectively comprising a vertically extending segment arranged along a plane that intersects the first substrate;
wherein the plurality of conductive routing layers comprise:
a first plurality of conductive interconnect layers arranged within a first inter-level dielectric (ILD) structure comprising a plurality of stacked ILD layers on the first substrate; and
a second ILD structure disposed between a second substrate and the first ILD structure and surrounding a second plurality of conductive interconnect layers, wherein the plurality of conductive routing layers further comprise the second plurality of conductive interconnect layers.

19. The integrated circuit of claim 18, wherein the plurality of conductive routing layers comprise:
a first via contacting a top of a first interconnect wire and coupling the first interconnect wire to a second interconnect wire, wherein the second interconnect wire defines a top of a first turn of the one or more turns; and
a second via contacting the top of the first interconnect wire and coupling the first interconnect wire to a third interconnect wire defining a top of a second turn of the one or more turns.

20. The integrated circuit of claim 18, wherein the plurality of conductive routing layers comprise a through-substrate via coupling a first interconnect wire defining a top of the inductor to a second interconnect wire defining a bottom of the inductor.

* * * * *